(12) United States Patent
Chen et al.

(10) Patent No.: US 10,946,658 B2
(45) Date of Patent: Mar. 16, 2021

(54) ENCAPSULATING A BONDED WIRE WITH LOW PROFILE ENCAPSULATION

(71) Applicant: HEWLETT-PACKARD DEVELOPMENT COMPANY, L.P., Spring, TX (US)

(72) Inventors: Chien-Hua Chen, Corvallis, OR (US); Michael W. Cumbie, Corvallis, OR (US); Zhuqing Zhang, Corvallis, OR (US)

(73) Assignee: Hewlett-Packard Development Company, L.P., Spring, TX (US)

( * ) Notice: Subject to any disclaimer, the term of this patent is extended or adjusted under 35 U.S.C. 154(b) by 0 days.

(21) Appl. No.: 16/737,279

(22) Filed: Jan. 8, 2020

(65) Prior Publication Data
US 2020/0139705 A1 May 7, 2020

Related U.S. Application Data

(63) Continuation of application No. 15/032,022, filed as application No. PCT/US2013/067117 on Oct. 28, 2013, now abandoned.

(51) Int. Cl.
*B41J 2/14* (2006.01)
*B41J 2/16* (2006.01)
(Continued)

(52) U.S. Cl.
CPC ......... *B41J 2/1433* (2013.01); *B41J 2/14024* (2013.01); *B41J 2/14072* (2013.01);
(Continued)

(58) Field of Classification Search
CPC .. B41J 2/1433; B41J 2/14024; B41J 2/14072; B41J 2/1623; B41J 2/1601; H01L 21/56; H01L 21/67126; H01L 24/85; H01L 2224/8592; H01L 2924/01004; H01L 2224/4382; H01L 2224/4845; H01L 2224/48464; H01L 2924/01047;
(Continued)

(56) References Cited

U.S. PATENT DOCUMENTS

| 5,018,003 A | 5/1991 | Yasunaga |
| 5,244,838 A | 9/1993 | Casati |

(Continued)

FOREIGN PATENT DOCUMENTS

| CN | 1297815 | 6/2001 |
| CN | 1495020 | 5/2004 |

(Continued)

OTHER PUBLICATIONS

A.C. Bowman; A Selective Encapsulation Solution for Packaging an Optical Microelectromechanical System; Jan. 2002;—httn://www.wni.edu/Puhs/ETD/Availahle/Rtd-0108102-140953/unrestricted/bnwman.ndf.

(Continued)

*Primary Examiner* — Nahida Sultana
(74) *Attorney, Agent, or Firm* — Middleton Reutlinger

(57) ABSTRACT

Encapsulating a bonded wire with low profile encapsulation includes applying encapsulation over a bonded wire that is connected to a die on a first end and to a circuit component on a second end and truncating a shape of the encapsulation to form a truncated shape.

4 Claims, 3 Drawing Sheets

(51) Int. Cl.
*H01L 23/00* (2006.01)
*H01L 21/56* (2006.01)
*H01L 21/67* (2006.01)

(52) U.S. Cl.
CPC ........... *B41J 2/1601* (2013.01); *B41J 2/1623* (2013.01); *H01L 21/56* (2013.01); *H01L 21/67126* (2013.01); *H01L 24/48* (2013.01); *H01L 24/85* (2013.01); *H01L 2224/4382* (2013.01); *H01L 2224/45005* (2013.01); *H01L 2224/45124* (2013.01); *H01L 2224/45139* (2013.01); *H01L 2224/45144* (2013.01); *H01L 2224/45147* (2013.01); *H01L 2224/45155* (2013.01); *H01L 2224/4845* (2013.01); *H01L 2224/48157* (2013.01); *H01L 2224/48464* (2013.01); *H01L 2224/8592* (2013.01); *H01L 2924/01004* (2013.01); *H01L 2924/01047* (2013.01); *H01L 2924/10253* (2013.01)

(58) Field of Classification Search
CPC . H01L 2224/45124; H01L 2224/45155; H01L 24/48; H01L 2224/45005; H01L 2224/45139; H01L 2924/10253; H01L 2224/45144; H01L 2224/45147; H01L 2224/48157
See application file for complete search history.

(56) References Cited

U.S. PATENT DOCUMENTS

| | | |
|---|---|---|
| 5,367,766 A | 11/1994 | Burns |
| 5,527,743 A | 6/1996 | Variot |
| 5,645,864 A | 7/1997 | Higuchi |
| 5,682,673 A | 11/1997 | Fehr |
| 6,071,427 A | 6/2000 | Raulinaitis |
| 6,246,111 B1 | 6/2001 | Huang |
| 6,340,846 B1 | 1/2002 | LoBianco et al. |
| 6,359,335 B1 | 3/2002 | Distefano |
| 6,577,013 B1* | 6/2003 | Glenn ............... H01L 23/3114 257/618 |
| 6,962,282 B2 | 11/2005 | Manansala |
| 7,527,090 B2 | 5/2009 | Dani |
| 7,819,506 B2 | 10/2010 | Graham et al. |
| 7,842,219 B2 | 11/2010 | Jung |
| 8,035,211 B2 | 10/2011 | Ko et al. |
| 8,399,296 B2 | 3/2013 | Chua |
| 8,558,400 B2 | 10/2013 | Park |
| 8,657,597 B2* | 2/2014 | Sandhu ............... G03F 7/0002 425/385 |
| 8,928,134 B2* | 1/2015 | Huang ............... H01L 21/561 257/686 |
| 2002/0109214 A1* | 8/2002 | Minamio ........... H01L 21/4821 257/676 |
| 2003/0082851 A1 | 5/2003 | Van Hoff |
| 2003/0127423 A1 | 7/2003 | Dlugokecki |
| 2003/0134496 A1 | 7/2003 | Lee |
| 2004/0184226 A1 | 9/2004 | Hall |
| 2006/0051948 A1 | 3/2006 | Kim |
| 2007/0139469 A1 | 6/2007 | Yasuda |
| 2007/0229575 A1 | 10/2007 | Graham et al. |
| 2008/0158298 A1 | 7/2008 | Serbicki et al. |
| 2009/0047606 A1* | 2/2009 | Schram ............... B82Y 10/00 430/322 |
| 2009/0061035 A1* | 3/2009 | Cho ............... B82Y 40/00 425/174.4 |
| 2009/0078744 A1 | 3/2009 | Silverbrook |
| 2009/0079081 A1 | 3/2009 | Silverbrook et al. |
| 2010/0034911 A1* | 2/2010 | Mori ............... B29C 43/021 425/89 |
| 2012/0133724 A1 | 5/2012 | Nishi |
| 2012/0256346 A1* | 10/2012 | Ogino ............... B81C 1/0046 264/293 |
| 2012/0305680 A1 | 12/2012 | Kaneko |
| 2013/0084397 A1 | 4/2013 | Erickson |
| 2013/0155150 A1 | 6/2013 | Miyazaki |
| 2013/0234371 A1* | 9/2013 | Yamaguchi ........... G03F 7/0002 264/446 |
| 2014/0061975 A1* | 3/2014 | Cho ............... B29C 48/92 264/447 |
| 2015/0064883 A1 | 3/2015 | Dykaar |
| 2015/0075855 A1 | 3/2015 | Ito |
| 2015/0306792 A1* | 10/2015 | Miyazawa ........... B29C 35/0888 264/496 |
| 2017/0221790 A1* | 8/2017 | Tomie ............... H01L 23/367 |
| 2020/0205292 A1* | 6/2020 | Inoue ............... H01L 24/45 |

FOREIGN PATENT DOCUMENTS

| | | |
|---|---|---|
| CN | 001371991 | 10/2004 |
| CN | 2846128 | 12/2006 |
| CN | 101211897 | 7/2008 |
| CN | 101341028 A | 1/2009 |
| CN | 201442383 | 4/2010 |
| CN | 102529416 | 7/2012 |
| EP | 1 095 773 A1 | 5/2001 |
| JP | 03197147 | 8/1991 |
| JP | 2002036616 | 2/2002 |
| JP | 2009184164 | 8/2009 |
| WO | WO-99626501 | 12/1999 |
| WO | WO-2009/039550 A1 | 4/2009 |

OTHER PUBLICATIONS

International Search Report and Written Opinion dated Jul. 17, 2014, PCT Patent Application No. PCT/US2013/067117 dated Oct. 28, 2013, Korean Intellectual Property Office.

* cited by examiner

| Apply encapsulation over a bonded wire that is connected to a die on a first end and to a circuit component on a second end | ~ 402 |
| Truncate a shape of the encapsulation to form a truncated shape | ~ 404 |

ENCAPSULATING A BONDED WIRE WITH LOW PROFILE ENCAPSULATION

CROSS REFERENCE TO RELATED APPLICATION

The present application is a continuation of U.S. patent application Ser. No. 15/032,022, filed on Apr. 25, 2016, which is a U.S. National Stage under 35 U.S.C. § 371 of International Patent Application No. PCT/US2013/067117, filed Oct. 28, 2013, the disclosures of which are hereby incorporated herein by reference.

BACKGROUND

Wire bonding involves forming a bond at either end of a wire, often with one end attached to a substrate and another end attached to a circuit board. The bonds may be wedge bonds where the wire is bonded directly to the circuit board or substrate using force and/or ultrasonic energy. Ball bonding, an alternative to wedge bonding, involves forming an electrically conductive ball and electrically joining the ball to both the wire's end and to the substrate or circuit board. After the electrical connections are made, the wire and its connections are encapsulated with ceramic, plastic, or epoxy to prevent physical damage or corrosion.

BRIEF DESCRIPTION OF THE DRAWINGS

The accompanying drawings illustrate various examples of the principles described herein and are a part of the specification. The illustrated examples are merely examples and do not limit the scope of the claims.

DETAILED DESCRIPTION

Thermal inkjet printers utilize bonded wires between the die that contains the inkjet nozzles and a printed circuit board. The die sizes of many versions of thermal inkjet products are large enough so that the encapsulation beads are easily placed far away from the first nozzle to avoid any significant interaction with serving the print head. However, to make products with tighter space, a film encapsulation process has been used that dispenses adhesive encapsulation in such a manner that reduces the encapsulation height. While the such a film encapsulation process does reduce the overall encapsulation height, the process is complex, sensitive to the adhesive patterns, prone to peeling during print head servicing, and tends to harbor trapped air under the encapsulation film.

The principles described herein include an apparatus that allows the encapsulation to be closer to the nozzles of a print head without the drawbacks that come with the film encapsulation procedures described above. Such an apparatus can include a bonded wire connected to a die on a first end of the wire and to a circuit component on a second end of the wire. An encapsulation material is disposed over the bonded wire where the encapsulation has a truncated shape. When the encapsulation material is initially deposited, the encapsulation material takes a shape that is determined by the encapsulation material's surface tension as well as other inherent characteristics. To deposit a sufficient amount of encapsulation material at the encapsulation's base in such a manner, the overall height of the encapsulation material will be high enough to interfere with servicing the print heads. For example, when wiping the surface of the print heads, ink and debris can get caught on the encapsulation material. Keeping the encapsulation material's height low often avoids the above mentioned issues. To keep the overall height of the encapsulation material low, such as under a hundred microns in height, the shape formed by the encapsulation material's surface tension is truncated. Such truncating can occur by compressing the encapsulation material with a stamp, grinding away a top portion of the encapsulation material, allowing a portion of the encapsulation material to wick under a guide spaced at a predetermined gap away from the surface being encapsulated, other procedures, or combinations thereof.

In the following description, for purposes of explanation, numerous specific details are set forth in order to provide a thorough understanding of the present systems and methods. It will be apparent, however, to one skilled in the art that the present apparatus, systems, and methods may be practiced without these specific details. Reference in the specification to "an example" or similar language means that a particular feature, structure, or characteristic described is included in at least that one example, but not necessarily in other examples.

Figure 1:
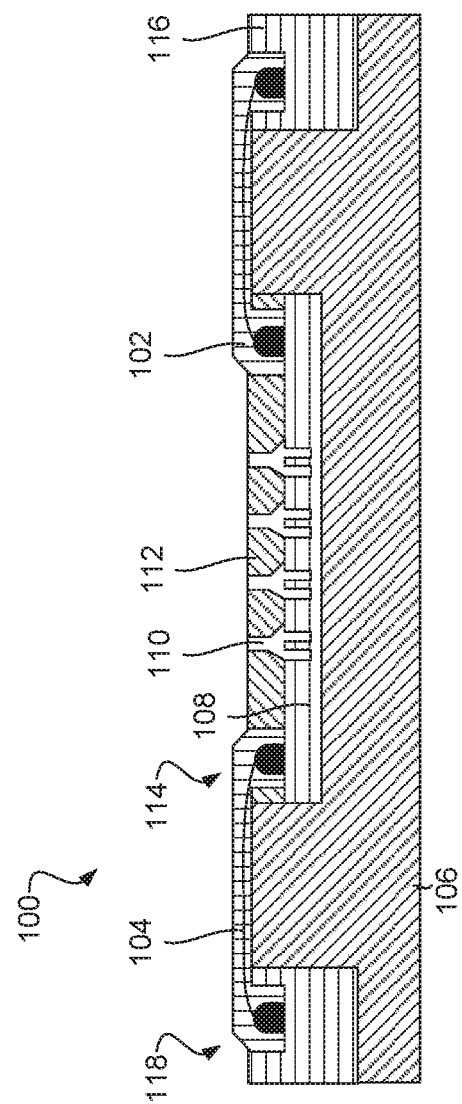
FIG. 1 is a diagram of an example of an apparatus with low profile encapsulation covering a bonded wire according to the principles described herein.

FIG. 1 is a diagram of an example of an apparatus (100) with low profile encapsulation (102) covering a bonded wire (104) according to the principles described herein. In this example, a compound (106) supports a die (108) that has ink fluid paths (110) formed therein. The die (108) is covered with a polymer layer (112). The bonded wire (104) is bonded to the die (108) at a first end (114) and to a printed circuit board (116) at a second end (118). The encapsulation (102) covers the bonded wire (104).

The compound (106) may be made of any appropriate type of material. In some examples, the compound (106) is an epoxy molded compound. The compound (106) may be selected for characteristics that are suitable for supporting the die (108) as well as the inkjet applications.

The die (108) may be a block of semiconductor material. In some examples, a functional circuit is fabricated on the die (108). Often, integrated circuits are produced in large batches on a single wafer of electronic-grade silicon or other semiconductor material through lithography processes, such as photolithography. The wafer may be cut into multiple pieces, each containing one copy of the circuit. Each of these pieces may be referred to as a die. In the example of FIG. 1, the die (108) also includes openings for inkjet nozzles. In some examples, the openings are shaped to form the nozzles. In other examples, the openings are shaped to receive nozzles.

Any appropriate type of semiconductor material may be used to construct the die (108). For example, silicon may be used as the die material. However, in other examples, metals like silver can also be incorporated into the die (108).

The printed circuit board (116) may include circuit components that communicate with the portions of the integrated circuit in the die (108). Such circuit components and communications may instruct the inkjet print heads when to fire.

The bonded wire (104) bridges the circuit components over the electrically insulating compound (106) thereby allowing firing signals to be communicated to the print heads from an off-site location.

The bonded wire (104) may be bonded to the die (108) or to the printed circuit board (116) with any appropriate type of bonding technique. For example, the bonds may be formed with wedge bonds, ball bonds, other types of bonds, or combinations thereof. The wire (104) may also include any appropriate type of shape, length, or geometry. For examples, the wire (104) may have a diameter of fifteen microns to hundreds of microns.

Further, the wire (104) may be made with any appropriate type of material. For example, the wire (104) may be made of gold, aluminum, copper, nickel, silver, other types of materials, or combinations thereof. Further, the wire (104) may be a single material or multiple materials, such as wires with at least one coating of a different type of material.

Copper may be used for fine wire ball bonding in sizes up to seventy five micrometers. Copper wire has the ability of being used at smaller diameters while providing a similar performance as gold without the high material cost. Copper wire up to two hundred fifty micrometers can be successfully wedge bonded with the proper set up parameters. Large diameter copper wire can replace aluminum wire where high current carrying capacities are used or where there are issues with complex geometry. Annealing and process tasks used by manufacturers enhance the ability to use large diameter copper wire to wedge bond to silicon without damaging the die.

Gold doped with controlled amounts of beryllium and/or other elements can be used for ball bonding. This process brings together the two materials that are to be bonded using heat, pressure, and ultrasonic energy. Junction size, bond strength, and conductivity parameters often determine the most suitable wire size for a specific gold wire bonding application.

Any appropriate type of encapsulation (102) may be used in accordance with the principles described herein. For example, the encapsulation (102) may be made of a ceramic, plastic, epoxy, thermoset polymer, silicone, polyurethane, another type of material, or combinations thereof. The encapsulation (102) can be used to prevent physical damage, corrosion, moisture contamination, or other undesirable conditions from reaching the bonded wire, the printed circuit board (116), portions of the die (108), other electronic components, or combinations thereof.

The encapsulation material may be applied to the desired areas of the printer by pouring a liquid resin over the desired area until the area is covered with the liquid resin such as with a needle dispense mechanism, a jet dispense mechanism, a spray coating mechanism, an adhesive stamping mechanism, another type of mechanism, or combinations thereof. In the absence of active shaping mechanisms, the encapsulation material will form a shape that is determined by the encapsulation material's surface tension, rheology, viscosity, and other characteristics.

In some examples, the encapsulation material is actively shaped while the liquid resin is applied to the desired area. For example, a guide may be spaced above a portion of the desired area at a predetermined gap while the liquid resin is applied. The guide may have a characteristic that causes the liquid resin to be drawn under an underside of the guide through a wicking action. As a result, the guide directs the liquid resin over the area to be encapsulated. The predetermined gap limits the height of the encapsulation's profile. In some examples, the height of the encapsulation is less than a hundred microns. In such an example, the predetermined gap is also less than a hundred microns. The underside of the guide can force the encapsulation material to have a top-hat profile. In such an example, the geometry of the underside of the guide creates the geometry of the top of the encapsulation material's shape. Thus, if the underside of the guide has a flat shape, the top surface of the encapsulation will also be flat.

In other examples, the liquid resin is allowed to form its shape based on the liquid resin's surface tension and other inherent characteristics. In such an example, the liquid resin can be compressed with a stamp or another device. As a result, the encapsulation will form a profile that reflects the geometry of the underside of the stamp. In such examples, the encapsulation will result in a truncated shape.

The guide and/or the stamp may be heated to lower the encapsulation's viscosity, allow the encapsulation to flow more freely, and speed up the curing of the encapsulation material. When the guide or the stamp is removed, the encapsulation material is allowed to cool and its viscosity increases thereby forming a solidified shape. In some examples where a stamp is used, the encapsulation may have solidified before the stamp is applied. In such examples, a heated stamp may provide enough energy to soften the encapsulation material enough to flow and/or compress under the pressure exerted with the stamp while the stamp is in contact with the encapsulation. Upon the stamp's removal, the encapsulation material cools and accordingly resolidifies.

In other examples, the truncated shape of the encapsulation may be formed through an appropriate mechanism. For example, the truncated shape may be formed by removing a top portion of the encapsulation. Such a portion may be removed by grinding, slicing, cracking, or otherwise degrading the top portion for removal.

Any appropriate type of truncated shape may be used in accordance with the principles described herein. While the examples above specifically refer to a flat surface of the encapsulation material, the truncated shape may also include features resulting from the mechanism that forms the truncated shape. For example, the truncated shape may include a flat surface that is slopped towards the die (108). As a result, wipers, tools, hands of individuals servicing the die (108), and so forth can access the die (108) without interference from the height of the encapsulation on the encapsulation's die-side. In such an example, the printed circuit board-side of the encapsulation may be higher than the die-side as a result. Such an example still allows access to the die (108), but provides more encapsulation over the printed circuit board (116) which may benefit from additional encapsulation.

Figure 2:
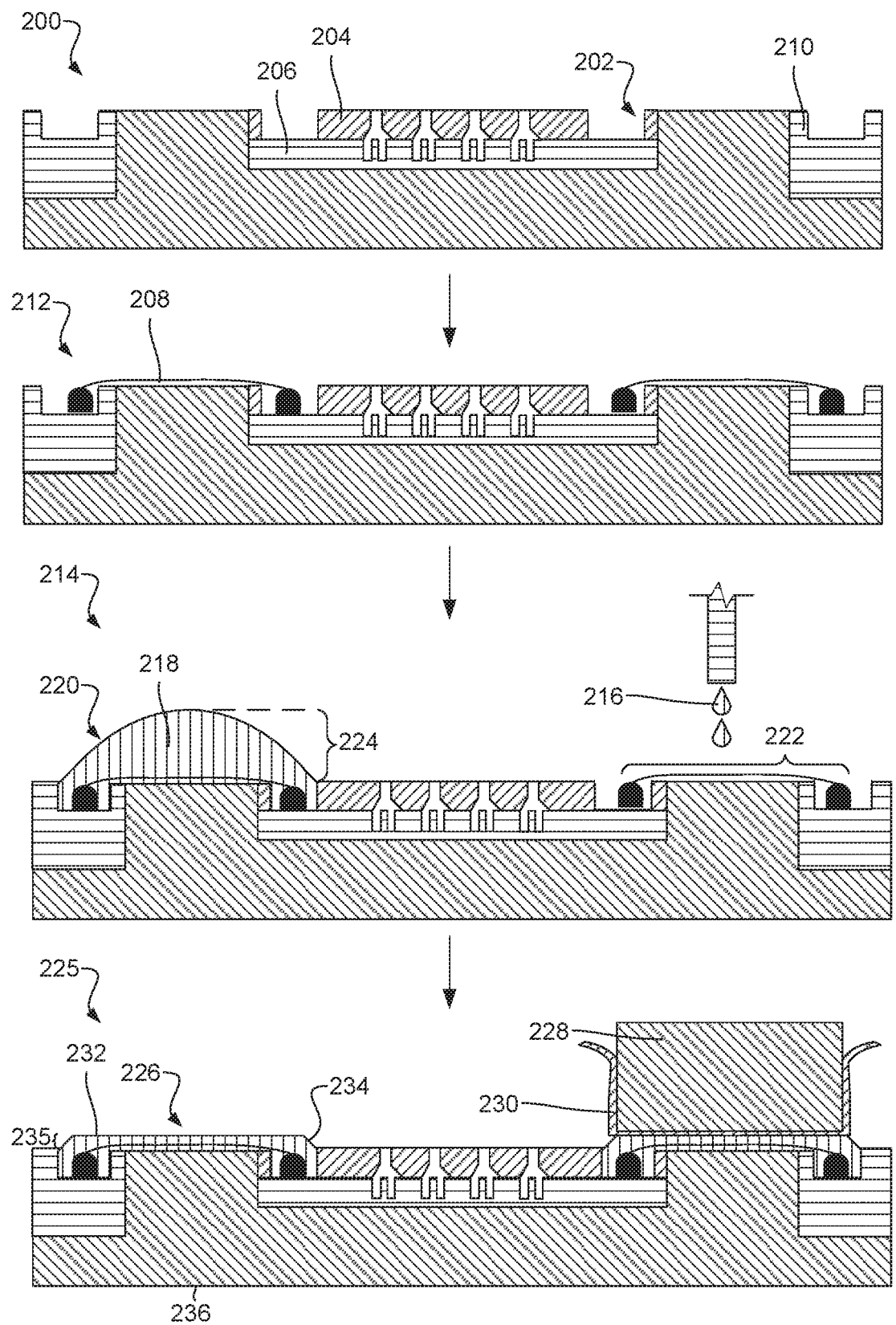
FIG. 2 is a diagram of an example of stages of manufacturing an apparatus with low profile encapsulation according to the principles described herein.

FIG. 2 is a diagram of an example of stages of manufacturing an apparatus with low profile encapsulation according to the principles described herein. In this example, a first stage (200) of manufacturing involves forming gaps (202) in the polymer covering (204) that covers the die (206). Such gaps (202) are formed over the locations on the die (206) where electrical contact with the die (206) and the bonded wire (208) are desired. During this stage, the location on the printed circuit board (210) is also prepared to receive its end of the bonded wire (208).

During a second stage (212), the wire (208) is bonded to the die (206) and the printed circuit board (210). Any appropriate type of bond may be used to electrically connect the die (206) and the printed circuit board (210) to the wire (208). For example, the bond may be a wedge bond, a ball bond, another type of bond, or combinations thereof. The bond between the bonded wire (208) and the die (206) is made in the gap (202) formed in the polymer covering (204).

In a third stage (214), a liquid resin (216) is applied over the bonded wire (208). As the liquid resin (216) cures, the liquid resin (216) forms a solidified shape (218) as encapsulation (220). The solidified shape (218) is formed based on the liquid resin's surface tension, temperature, rheology characteristics, viscosity, other inherent characteristics, and combinations thereof. To provide enough encapsulation (220) along a length (222) of the bonded wire (208), the height (224) of the encapsulation's solidified shape (218) is high enough that the encapsulation (220) may interfere with servicing the print heads. For example, the height (224) of the encapsulation (220) may interfere with wiping actions or allowing tools to access the die (206).

In a fourth stage (225), the truncated shape (226) of the encapsulation is formed. In this example, a stamp (228) is pressed over the solidified shape (218) to form the truncated shape (226). The stamp (228) may include a coating (230) that prevents the encapsulation (220) from bonding with the stamp (228). The coating (230) may be any appropriate type of coating. For example, the coating may be a plastic, a polyethylene terephthalate, polytetrafluoroethylene, another type of material, or combinations thereof.

Further, the stamp (228) may be heated to lower the encapsulation's viscosity while the stamp is (228) compressing the encapsulation (220). As a result, the encapsulation (220) will have a truncated shape (226).

The truncated shape (226) may have a portion that retains the solidified shape (218) and a truncated portion (232). In the example of FIG. 2, the solidified shape (218) is retained proximate the base (234) of the encapsulation (220) and the truncated portion (232) is the portion that is flat. In this example, the truncated shape (226) has a top-hat profile. While this example has been described with specific reference to a flat surface, in other examples, the truncated shape has a slopped, slanted, curved, or other type of surface that allows access to the die (206).

In some examples, the truncated height (235) of the encapsulation (220) from its base, such as where the encapsulation (220) contacts the compound (236), to the truncated portion (232) is less than a hundred microns. In some examples, the truncated height is between twenty five microns and a hundred microns. In such an example, the stamp (228) is brought within the appropriate distance from the compound (236). The stamp (228) may be brought to the truncated height (235) instantaneously or the stamp (228) may be brought to the truncated height (235) over a predetermined period of time to allow the heat from the stamp (228) to transfer to the encapsulation (220) or allow the encapsulation (220) to flow with an increasing amount of pressure exerted from the stamp (228).

Figures 3, 4:
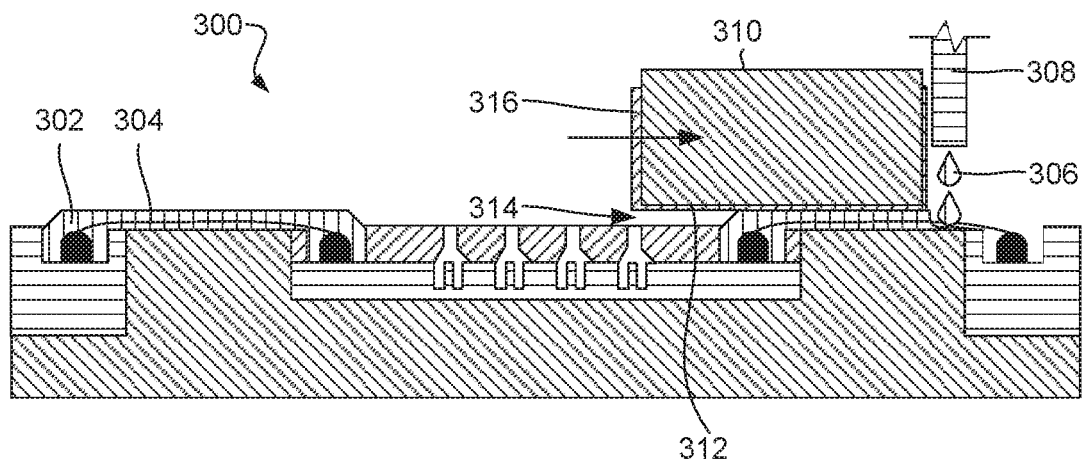
FIG. 3 is a diagram of an example of an apparatus with low profile encapsulation covering a bonded wire according to the principles described herein.
FIG. 4 is a diagram of an example of a method for encapsulating a bonded wire with low profile encapsulation according to the principles described herein.

FIG. 3 is a diagram of an example of an apparatus (300) with low profile encapsulation (302) covering a bonded wire (304) according to the principles described herein. In this example, the liquid resin (306) is applied from an applicator (308) to the area where encapsulation (302) is desired. A guide (310) is positioned adjacent the region where the liquid resin (306) is applied. The guide (310) is close enough to the applied liquid resin (306) that the liquid resin (306) is attracted to the underside (312) of the guide (310) and is wicked along a length of the underside (312).

Any appropriate type of applicator (308) may be used in accordance with the principles described herein. For example, the applicator (308) may be a needle applicator, a dropping applicator, a jetting applicator, a spray applicator, another type of applicator, or combinations thereof.

The guide (310) is positioned to form a gap (314) between the apparatus (300) and the underside (312) of the guide (310) that is equal to the desired truncated height for the encapsulation's shape. Due to the wicking characteristics of the guide (310) and the liquid resin (306), the liquid resin (306) is drawn into and fills the gap (314).

The gap (314) may be formed in any appropriate manner in accordance with the principles described herein. For example, a spacer may be incorporated into the underside (312) of the guide (310) to ensure that the gap (314) is correct. Such a spacer may include a mechanism for causing the liquid resin (306) to pass around the spacer as the liquid resin (306) is applied to the desired area. In other examples, a computer implemented mechanism may use distance sensors to determine the distance between the underside (312) of the guide (310) and the top surface of the apparatus (300). Such a distance sensor may use the travel of sound, the travel of optical waves, a mechanical probe, another mechanism, or combinations thereof. In some examples, the distance sensors are incorporated directly into the guide (310) or the stamp (228, FIG. 2).

The guide (310) can be stationary or can be moved along the length of the bonded wire (304) along with the applicator (308) as the liquid resin fills the space underneath the guide (310). As a result, the gap (314) is progressively moved along the bonded wire's length and additional liquid resin (306) fills the new space. As a result, the liquid resin (306) solidifies along the length of the bonded wire (304). The resulting shape is truncated as the guide (310) causes the shape to have a flat top that would not have otherwise formed without the active interaction with the guide (310). The guide (310), like the stamp (228, FIG. 2), may have a coating (316) to prevent the liquid resin (306) form attaching to the guide (310).

The liquid resin (306) may cure in place while the guide (310) is still forming the gap (314). In some examples, the liquid resin (306) is partially cured before the guide (310) is removed. The curing process may occur as the liquid resin (306) is allowed to air cool. In other examples, the curing process is accelerated by actively cooling the liquid resin (306) into encapsulation by actively cooling the liquid resin (306).

In some examples, the encapsulation is cured in place with exposure to certain ultraviolet wavelengths. Such wavelengths of light may be guided to the encapsulation through the guide (310), the stamp (228, FIG. 2), another type of tool, or combinations thereof.

While these examples have been described with reference to forming the truncated shape by stamping and using a guide, any appropriate mechanism for forming the truncated shape may be used. For example, the truncated shape may be formed by grinding, blading, slicing, or otherwise using another type of tool to shape the truncation.

FIG. 4 is a diagram of an example of a method (400) for encapsulating a bonded wire with low profile encapsulation according to the principles described herein. In this example, the method (400) includes applying (402) encapsulation over a bonded wire that is connected to a die on a first end and to a circuit component on a second end and truncating (404) a shape of the encapsulation to form a truncated shape.

In some examples, the truncated shape is formed through a compressive mechanism. For example, a stamp can be used to flatten the surface of the encapsulation or shorten the encapsulation's height. In other examples, other devices can be used to flatten the top and reduce the encapsulation's height. In some examples, the compressed encapsulation material may have a higher density than other encapsulation materials that are allowed to retain their shapes that are determined by the encapsulation material's surface tension and other properties. The compression may provide the example of removing air bubbles from the encapsulation. Further, the compression may aid in forming a stronger bond between the die, bonded wire, printed circuit board, or other surface areas of the apparatus and the encapsulation. As a result, the encapsulation may be less prone to delaminating.

In some examples, the shape is truncated by allowing the encapsulation to wick under a guide while simultaneously depositing the encapsulation and moving the guide along a length of the wire. In yet other examples, the truncated shape is formed by grinding or otherwise removing a portion of the encapsulation.

The temperature of the liquid resin used to form the encapsulation material may be controlled during the encapsulation process. A mechanism may be implemented to cause the liquid resin to have a high enough temperature to flow easily during application processes, compression processes, grinding processes, or other processes for forming the truncated shapes. Likewise, when the liquid resin is formed in the desirable truncated shape, the liquid resin may be actively cooled to cause the encapsulation to retain the desired shape. Active cooling may occur by use of a fan, cooling the stamp or guide, or other mechanism that will cool the encapsulation.

An advantage of the principles described herein is that the processes of stamping, guiding, blading, grinding, or otherwise forming a truncated shape is relatively inexpensive as compared to creating a low profile encapsulation through a film deposition technique. Further, the principles described herein may involve a single process for forming the truncated shape as the liquid resin is applied. In other examples, the principles described herein may involve multiple processes such as first depositing the encapsulation, allowing that encapsulation to form whatever shape is inherent to the encapsulation based on the encapsulation's inherent properties, and truncating that natural shape.

Further, the principles described herein allow for the encapsulation to be closer to the print heads and/or nozzles. Such an advantage allows for the electronics in printers (or the printers themselves) to be made smaller. As a result, the printers can be less expensive and more compact.

While the principles described herein have been described with reference to specific types of devise, the principles described herein can be applied to any appropriate type of apparatus. For example, the principles described herein may be applied to printers, micro-electronic components, other types of apparatus, or combinations thereof.

The preceding description has been presented only to illustrate and describe examples of the principles described. This description is not intended to be exhaustive or to limit these principles to any precise form disclosed. Many modifications and variations are possible in light of the above teaching.

What is claimed is:

1. A method for encapsulating a bonded wire with low profile encapsulation, comprising:
    applying an encapsulation material over a bonded wire, the bonded wire being connected to a die on a first end, and the bonded wire being connected to a circuit component on a second end;
    positioning a shaping guide on a top side of an initially applied portion of the encapsulation material to create a gap between an underside of the shaping guide and a top side of the circuit component,
        wherein the underside of the shaping guide includes a spacer to create the gap between the underside of the shaping guide and the top side of the circuit component; and
    shaping, using the shaping guide, and while applying the encapsulation material over the bonded wire, the encapsulation material into a truncated shape having a truncated height,
        wherein the truncated shape reflects a geometry of an underside of the shaping guide, and
        wherein the truncated height is less than a hundred microns in height.

2. The method of claim 1, wherein shaping the encapsulation material into the truncated shape having the truncated height includes moving the shaping guide along a length of the bonded wire while applying the encapsulation material.

3. The method of claim 2, wherein shaping the encapsulation material into the truncated shape having the truncated height includes allowing the encapsulation material to wick under the shaping guide while applying the encapsulation material.

4. The method of claim 1, wherein the spacer allows the encapsulation material to fill space in the gap created by the spacer.

* * * * *